United States Patent [19]

Grothause

[11] Patent Number: 4,904,992
[45] Date of Patent: Feb. 27, 1990

[54] RADIO WITH MESSAGE RECEPTION AND AMBIENT NOISE LEVEL CONTROLLED INDICATOR

[75] Inventor: Timothy A. Grothause, Sunrise, Fla.

[73] Assignee: Motorola, Inc., Schaumburg, Ill.

[21] Appl. No.: 330,324

[22] Filed: Mar. 28, 1989

[51] Int. Cl.$^4$ .............................................. H04Q 7/02
[52] U.S. Cl. .............................. 340/825.44; 455/297; 340/311.1; 340/692
[58] Field of Search ................ 340/311.1, 825.44, 691, 340/692, 527, 815.01; 455/221, 230, 254, 296, 212, 297; 367/197, 198, 199

[56] References Cited

U.S. PATENT DOCUMENTS

| | | | |
|---|---|---|---|
| 4,342,023 | 7/1982 | Tsunoda et al. | 340/692 |
| 4,352,091 | 9/1982 | Yamasaki | 340/311.1 |
| 4,356,519 | 10/1982 | Cogdell, Jr. | 340/311.1 |
| 4,380,824 | 4/1983 | Inoue | 455/297 |

FOREIGN PATENT DOCUMENTS

| | | | |
|---|---|---|---|
| 3210800 | 10/1983 | Fed. Rep. of Germany | 340/311.1 |
| 0177035 | 8/1986 | Japan | 340/311.1 |
| 2136181 | 9/1984 | United Kingdom | 340/311.1 |

*Primary Examiner*—Donald J. Yusko
*Assistant Examiner*—D. Magistre
*Attorney, Agent, or Firm*—Thomas G. Berry

[57] ABSTRACT

A radio (10) measures and stores (16, 18) the ambient sound (or noise) level of its environment. When a message is received, the current noise (or sound) level is compared to a threshold (56). If the ambient noise level is such that an audible tone may not be heard by the radio user, a silent alert is automatically activated (62) regardless of whether the silent enunciator has been previously selected (enabled) by the radio user. In another aspect of the present invention, if the ambient noise level is such that an audible tone may be inappropriate (i.e., library, courtroom, or certain hospital areas), the silent alert is also automatically activated regardless of whether the silent enunciator is enabled so as not to disturb others.

25 Claims, 2 Drawing Sheets

RADIO WITH MESSAGE RECEPTION AND AMBIENT NOISE LEVEL CONTROLLED INDICATOR

TECHNICAL FIELD

This invention relates generally to radios, and more specifically to radios having a message reception enunciator or indicator to inform the radio operator that a message has been received.

BACKGROUND ART

Many contemporary radios offer a message reception indicator to inform the radio's operator that a message has been received. For example, radio pagers present an audible tone to alert the user that a paging message has been received. For those instances where the individual using the pager does not wish an audible tone to sound, some pagers provide a silent message reception indicator (typically comprising a vibrator) so that an individual wearing the pager will physically feel the vibrations and understand that a paging message has been received.

A problem arises, however, when a pager has its audible tone indicator selected (i.e., the silent alert is disabled) and the pager wearer enters an environment having a high ambient sound (or noise) level. In a high noise environment, it may be impossible for the pager user to hear the audible alert, and thus, fail to respond to the paging message. For physicians and other emergency personnel, failure to respond to a paging message could result in catastrophic circumstances. Accordingly, there is a need to insure that a paging user will be alerted to the reception of a paging message regardless of the noise (or sound) level in the area where the paging user resides.

SUMMARY OF THE INVENTION

Accordingly, it is an object of the present invention to provide a radio having a message reception indicator that alerts the radio user of a received message regardless of the ambient noise or sound level.

Briefly, according to the invention, the radio measures and stores the ambient sound (or noise) level of its environment. When a message is received, the current noise (or sound) level is compared to a threshold. If the ambient noise level is such that an audible tone may not be heard by the radio user, a silent alert is automatically activated regardless of whether the silent enunciator has been previously selected (enabled) by the radio user. In this way, the radio operator will feel the vibrations of the silent alert indicator and be able to respond to the received message.

In another aspect of the present invention, if the ambient noise level is such that an audible tone may be inappropriate (i.e., library, courtroom, or certain hospital areas), the silent alert is also automatically activated regardless of whether the silent enunciator is enabled so as not to disturb others.

DETAILED DESCRIPTION OF THE PREFERRED EMBODIMENT

Figure 1:
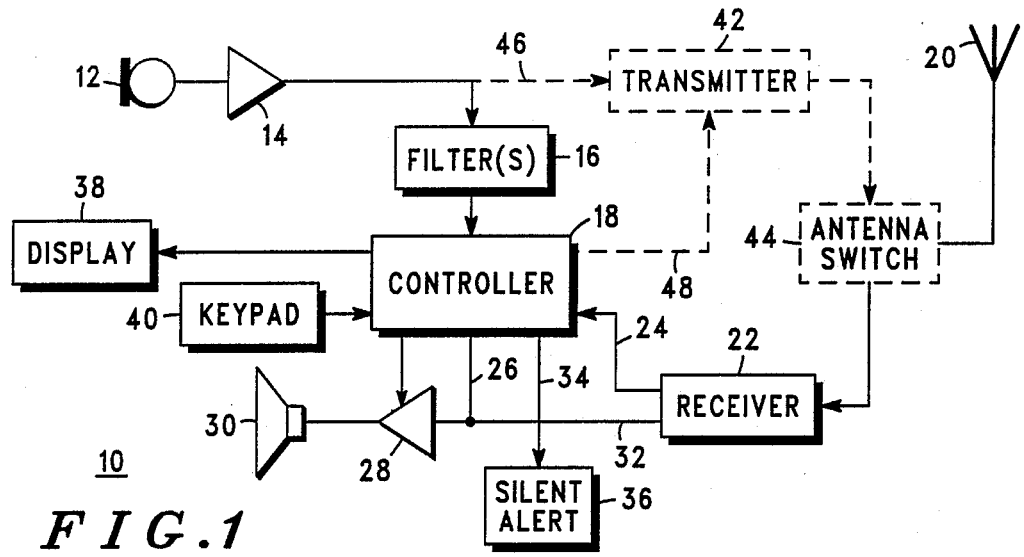
FIG. 1 is a block diagram of a radio in accordance with the present invention.

Referring to FIG. 1, a radio 10 in accordance with the present invention includes a microphone 12, which is coupled to an amplifier 14 for providing an amplified version of the ambient sound (or noise) level to a filter(s) 16. Preferably, the filter(s) 16 selects the audible frequency band for analysis by a controller 18, so that the ambient sound (or noise) level may be determined and stored. Optionally, other frequency bands or a plurality of subbands may be provided by the filter 16 to the controller 18 for a more complicated spectral analysis of the surrounding sound (or noise) environment. Preferably, the controller 18 comprises an MC 68HC05C4 microcontroller, having on-chip analog-to-digital converters, memory, and control circuitry. The controller 18 processes the filtered information to maintain a digital representation of the ambient sound (or noise) level. This level will be compared against a threshold (also stored within the controller 18) when a message is received.

To receive a message, a radio frequency signal is routed from an antenna 20 to a receiver 22, which may be of conventional design. The receiver 22 provides data messages to the controller 18 via a data line 24. Typically, a received message will be preceded by a digital address code, which the controller 18 will receive via the data line 24. After detecting an appropriate address signal, the controller operates to alert the radio user and present the message in a variety of ways depending upon the message type and optional features that may be enabled or disabled by the radio user. Thus, the controller 18 may send an alert signal 26 to an amplifier 28 to be presented to the radio operator via the speaker 30. After the alert, a voice message 32 may be provided by the receiver 22 to the amplifier 28 for presentation via the speaker 30. Data messages would follow the radio's address code to the controller (via the data line 24) for presentation on the display 38. Optionally, the radio user may have selected a silent alert feature (via the keypad 40). If so, the controller 18 would activate (34) the silent alert vibrator 36 so that the radio user would be alerted to the message reception by physically feeling the vibrations.

Optionally, the present invention can be incorporated in a two-way radio by including a transmitter 42 and an antenna switch 44 to selectively couple the antenna 20 to either the receiver 22 or the transmitter 44. In this way, voice messages 46 and data messages 48 may be provided to the transmitter 42 to be broadcast to other receivers or transceivers.

The present invention contemplates that the radio user may enter a wide variety of sound (or noise) environments during day-to-day operations. For example, a plant manager may operate partly in an office environment, and partially in manufacturing environment. If the radio operator has selected the audible alert feature (via the keypad 40) or has inactivated the silent alert vibrator 36, it may be impossible for the radio user to hear the audible alert when operating in a high noise (or sound level) environment. Thus, the radio user may not respond to a received message since he or she is unaware of its reception. Accordingly, the present invention operates to compare the ambient sound (or noise level) to a threshold level whenever a message is received. If the ambient noise level is such that the operator may not hear the audible tone the present invention operates to override the radio user's alert selection and activate the silent alert so that the radio user has the best opportunity to respond to the received message.

Figure 2:
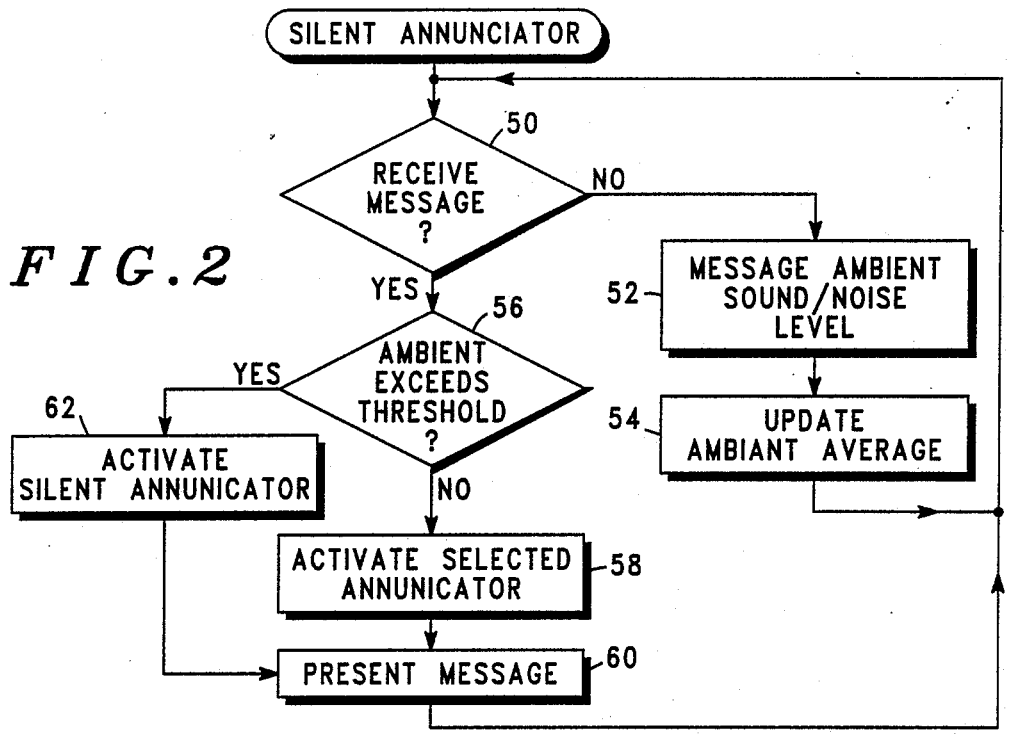
FIG. 2 is a flow diagram illustrating the operation of the radio of FIG. 1.

Referring to FIG. 2, the steps executed by the radio 10 are shown. Decision 50, determines whether a message has been received. If not the routine proceeds to step 52 where the ambient noise (or sound level) is measured by the controller 18. Next, the present ambient noise (or sound) average is updated by the controller 18 and the routine returns to decision 50. In this way, a current update of the sound level of the radio user's environment is maintained by the radio 10. When a message is received, decision 56 determines whether the ambient sound exceeds the threshold level by any of several known digital comparison techniques. If the noise is not above the threshold level, the selected enunciator (either audible or silent alert) is activated in step 58. Following this, the message is presented to the operator either via the display 38 for digital message or via the speaker 30 for a voice message. However, assuming that the determination of decision 56 is that the current ambient sound (or noise) level is above the threshold, the silent enunciator is activated in step 62 regardless of whether the operator has selected or enabled the audible tone enunciator. Following this, the message is presented in step 60 so that the operator has its best opportunity to understand that a message has been received.

Figure 3:
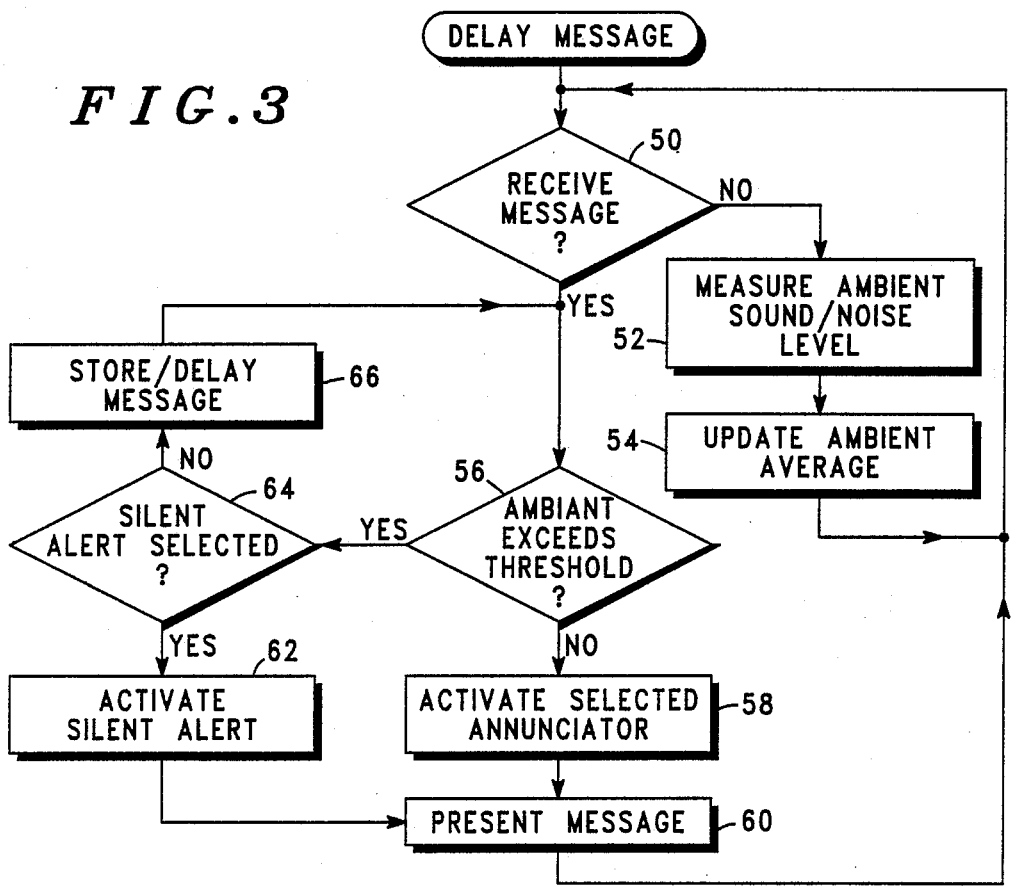
FIG. 3 is a flow diagram illustrating an optional sequence for the radio of FIG. 1.

Referring to FIG. 3, an optional sequence of steps for the radio 10 are illustrated. Decision 50 determines whether a message has been received. If not, the radio 10 operates to measure the ambient sound (or noise) level (step 52). This is used to update the stored ambient average (step 54) so that the controller 18 maintains a current ambient sound (or noise) value. When a message is received, decision 56 determines whether the current ambient sound (or noise) level exceeds the threshold stored within the controller 18. If not, the selected enunciator (either audible tone or silent alert) is activated in step 58, after which the message is presented to the operator in step 60 (via the display 38 or dated messages and via the speaker 30 for voice messages). Assuming, however, that determination of decision 56 is that the ambient sound (or noise) level exceeds the threshold, the routine is routed to decision 54, which determines whether the silent alert feature has been selected (i.e., enabled). If so, the silent alert is activated in step 62 so as to immediately provide the radio user with the enunciation of message reception. Following this, the message is presented in step 60.

However, if the determination of decision 64 is that the silent alert is not selected, the routine is routed to step 66. which stores or delays the message until such time as the ambient sound falls below the threshold (as determined by step 56). To do this, step 66 operates to store data messages within the controller 18, while voice messages require the extra step of being digitized before they could be stored or delayed. The optional routine of FIG. 3 does not override the radio operator's choice of enunciator and delays messages when the tone alert has been selected. This provides the radio operator with a choice to receive only tone alerts (at the risk of receiving delayed messages), and those skilled in the art will appreciate that the store/delay function of step 66 may be the only choice for those radios that does not have the silent enunciators installed therein.

Figure 4:
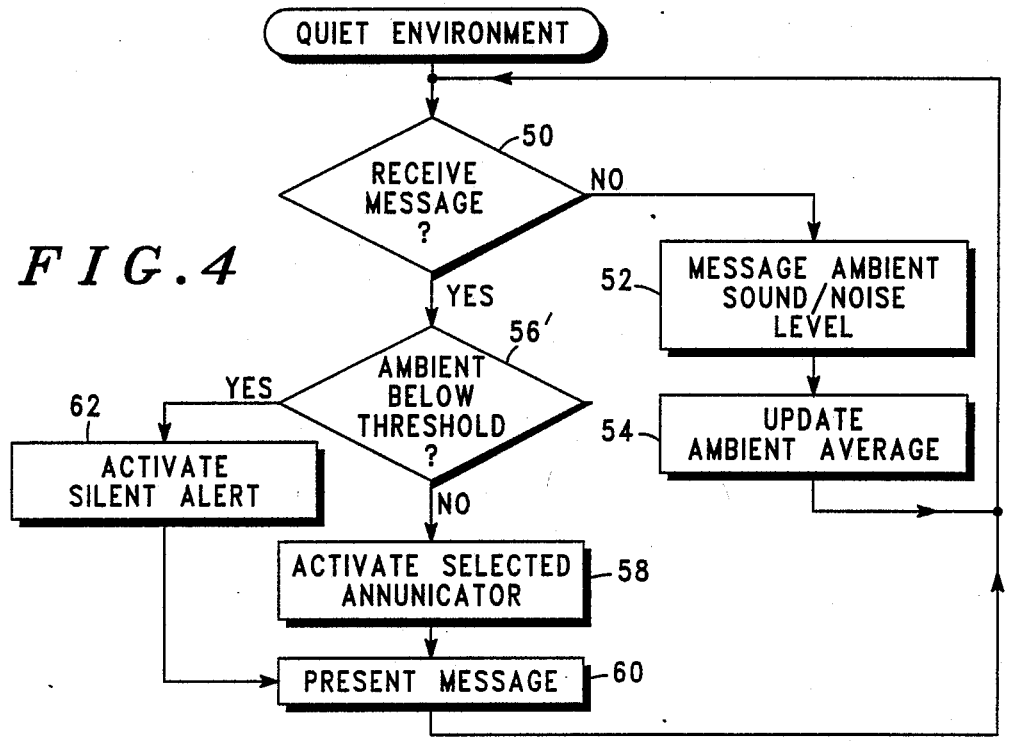
FIG. 4 is a flow diagram illustrating another optional sequence for the radio of FIG. 1.

Referring to FIG. 4, the optional steps executed by the radio 10 so as not to disturb quite areas are shown. Decision 50, determines whether a message has been received. If not, the routine proceeds to step 52 where the ambient noise (or sound level) is measured by the controller 18. Next, the present ambient noise (or sound) average is updated by the controller 18 and the routine returns to decision 50. In this way, a current update of the sound level of the radio user's environment is maintained by the radio 10. When a message is received, decision 56' determines whether the ambient sound is below another threshold level by any of several known digital comparison techniques. This threshold level preferably corresponds to an extraordinarily quite area, such as, for example, a library, courtroom, or certain hospital areas where the audible alert tone may be disturbing to others in the area.

If the ambient noise is not below this threshold level, the selected enunciator (either audible or silent alert) is activated in step 58. Following this, the message is presented to the operator either via the display 38 for digital message or via the speaker 30 for a voice message. However, assuming that the determination of decision 56' is that the current ambient sound (or noise) level is below the threshold, the silent enunciator is activated in step 62 regardless of whether the operator has selected or enabled the audible tone enunciator. Following this, the message is presented in step 60 so that the operator may understand that a message has been received without disturbing others in the area.

What is claimed is:

1. A radio, comprising:
   means for determining ambient sound level;
   means for receiving an information signal;
   means for comparing said ambient sound level to a threshold level, and for providing a control signal when said ambient sound level is at least equal to said threshold; and
   delay means for delaying activation of a message received indicator in response to said control signal.

2. The radio of claim 1, which includes means for transmitting an information signal.

3. The radio of claim 1, wherein said delay means comprises means for delaying activation of an audible tone message received indicator.

4. The radio of claim 1, wherein said delay means comprises means for delaying activation of said message received indicator when an audible tone message received indicator is enabled, and for not delaying said message received indicator when a silent alert message received indicator is enabled.

5. The radio of claim 1, wherein said means for determining ambient sound level comprises means for determining ambient sound energy residing in an audible frequency band.

6. The radio of claim 1, wherein said means for determining ambient sound level comprises means for determining ambient noise energy residing in a predetermined frequency band.

7. A radio, comprising:
   means for determining ambient sound level;
   means for receiving an information signal;
   means for comparing said ambient sound level to a threshold level, and for providing a control signal when said ambient sound level is at least equal to said threshold; and means for activating a silent alert indicator when said control signal is present, and for activating an audible indicator or said silent indicator when said control signal is absent, depending upon which of said audible or silent indictor is enabled.

8. The radio of claim 7, wherein said means for determining ambient sound level comprises means for determining ambient sound energy residing in an audible frequency band.

9. The radio of claim 7, wherein said means for determining ambient sound level comprises means for determining ambient noise energy residing in a predetermined frequency band.

10. The radio of claim 7, which includes means for transmitting an information signal.

11. A radio, comprising:
  means for providing a audible alert;
  means for providing a silent alert;
  means for determining ambient sound level;
  means for receiving an information signal;
  means for comparing said ambient sound level to a threshold level, and for providing a control signal when said ambient sound level is at least equal to said threshold; and
  means for activating said silent alert when said control signal is present, and for activating said audible alert or said silent alert when said control signal is absent, depending upon which of said audible or silent alert is enabled.

12. The radio of claim 11, wherein said means for determining ambient sound level comprises means for determining ambient sound energy residing in an audible frequency band.

13. The radio of claim 11, wherein said means for determining ambient sound level comprises means for determining ambient noise energy residing in a predetermined frequency band.

14. The radio of claim 11, which includes means for transmitting an information signal.

15. In a radio, a method for indicating reception of a message, comprising the steps of:
  (a) receiving a message signal to provide a received signal;
  (b) determining ambient sound level;
  (c) comparing said ambient sound level to a threshold, and asserting a control signal when said ambient sound level is at least equal to said threshold;
  (d) activating a silent message received indicator when said control signal is asserted and activating either an audible message received indicator or said silent message received indicator when said control signal is absent, depending upon which of said silent or audible message received indicators is enabled.

16. The method of claim 15, wherein step (b) comprises: determining sound energy residing in an audible spectral band.

17. The method of claim 15, wherein step (b) comprises: determining noise energy residing in a predetermined frequency band.

18. In a radio, a method for indicating reception of a message, comprising the steps of:
  (a) receiving a message signal to provide a received signal;
  (b) determining ambient sound level;
  (c) comparing said ambient sound level to a threshold, and asserting a control signal when said ambient sound level is at least equal to said threshold;
  (d) delaying activation of a message received indicator when said control signal is present and activating said message received indicator when said control signal is absent.

19. The method of claim 18, which includes the step of: (a1) comparing an address code to at least a portion of said received message.

20. The method of claim 18, wherein step (b) comprises: determining sound energy residing in an audible spectral band.

21. The method of claim 18, wherein step (b) comprises: determining noise energy residing in a predetermined frequency band.

22. A radio, comprising:
  means for determining ambient sound level;
  means for receiving an information signal;
  means for comparing said ambient sound level to a threshold level, and for providing a control signal when said ambient sound level is equal to or below said threshold; and
  means for activating a silent alert indicator when said control signal is present, and for activating an audible indicator or said silent indicator when said control signal is absent, depending upon which of said audible or silent indicator is enabled.

23. The radio of claim 22, wherein said means for determining ambient sound level comprises means for determining ambient sound energy residing in an audible frequency band.

24. The radio of claim 22, wherein said means for determining ambient sound level comprises means for determining ambient noise energy residing in a predetermined frequency band.

25. The radio of claim 22, which includes means for transmitting an information signal.

* * * * *